United States Patent [19]

Estep et al.

[11] 3,977,840

[45] Aug. 31, 1976

[54] SOLDERABLE THIN FILM MICROCIRCUIT WITH STABILIZED RESISTIVE FILMS

[75] Inventors: Gordon J. Estep, Agoura; Bernard Lee Burton, Simi, both of Calif.

[73] Assignee: The Bendix Corporation, North Hollywood, Calif.

[22] Filed: May 2, 1975

[21] Appl. No.: 574,651

Related U.S. Application Data

[60] Division of Ser. No. 507,184, Sept. 9, 1974, Pat. No. 3,904,461, which is a continuation of Ser. No. 293,988, Oct. 2, 1972, abandoned.

[52] U.S. Cl. .................................. 29/195; 148/13
[51] Int. Cl.² ........................................ B32B 15/04
[58] Field of Search .......... 29/195 M, 195 G, 195 P, 29/194, 199

[56] References Cited
UNITED STATES PATENTS 3,622,410  11/1971  Carlson ................................. 156/17

*Primary Examiner*—L. Dewayne Rutledge
*Assistant Examiner*—E. L. Weise
*Attorney, Agent, or Firm*—Robert C. Smith; William F. Thornton

[57] ABSTRACT

A metalization process for the manufacture of hybrid integrated circuit elements including boards and semiconductors to be attached thereto involves applying to a substrate of insulating material such as aluminum oxide, successive layers of sputtered nickel-chromium and nickel, an electroless deposit of nickel-boron and, frequently, an electro-deposited layer of gold. The assembly is then normally heat-treated to stabilize the resistive layer. The addition of the nickel-boron layer provides many advantages in that reliable low-temperature solder connections may be made to it, ultrasonic wire bonds of high reliability may be accomplished with the usual aluminum wire supplied with most discrete components, the heat-treating step is considerably shortened in time with greater stability of resistance values, and the assemblies thus manufactured are capable of operating in comparatively high-temperature environments. The same metalization process applied to semiconductors renders them easily solderable and avoids using high temperature eutectic bonding with the accompanying exposure of the semiconductors to elevated temperatures, often for prolonged periods. As a result, circuit assemblies thus manufactured are readily repairable, in most instances, since no high-temperature bonds are required.

5 Claims, 7 Drawing Figures

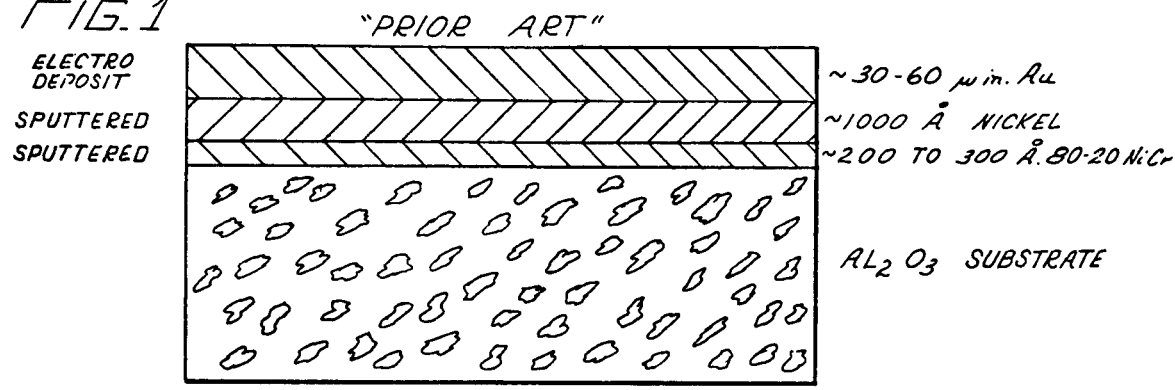
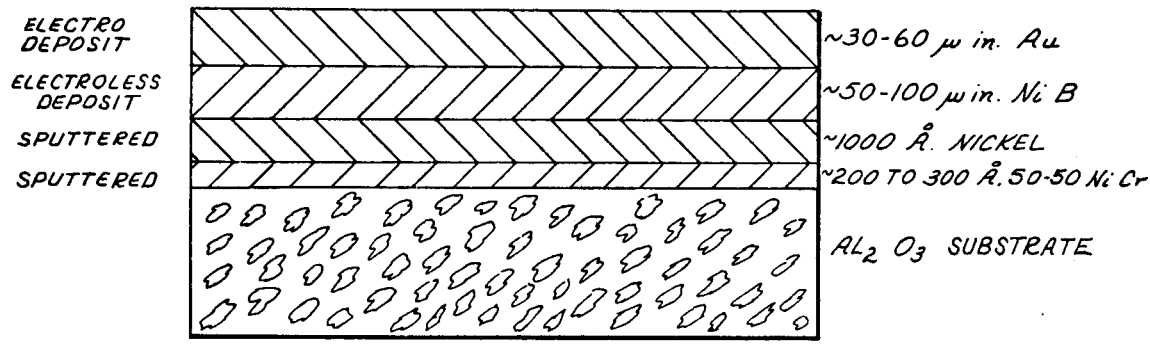
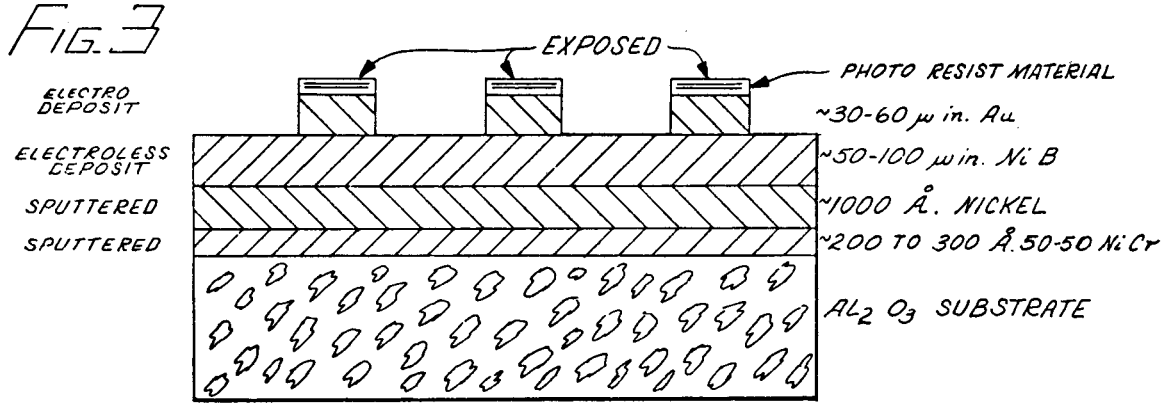
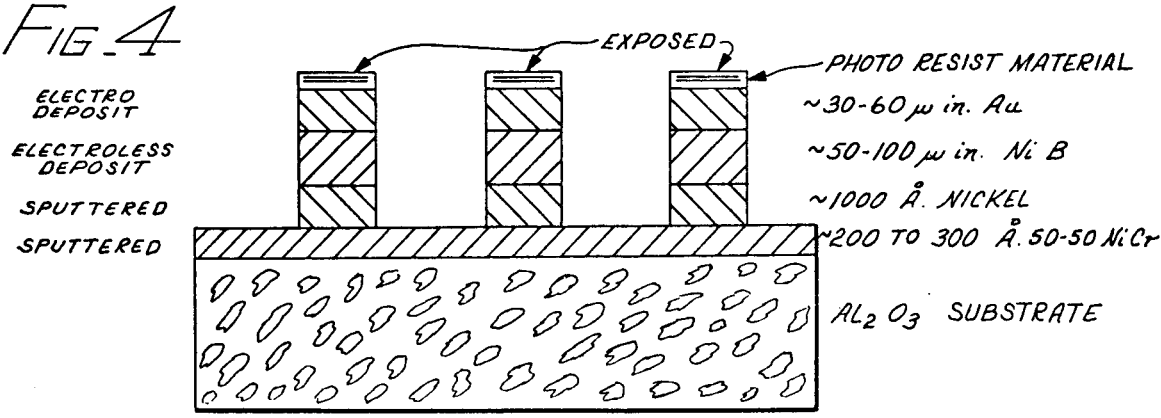

FIG_5
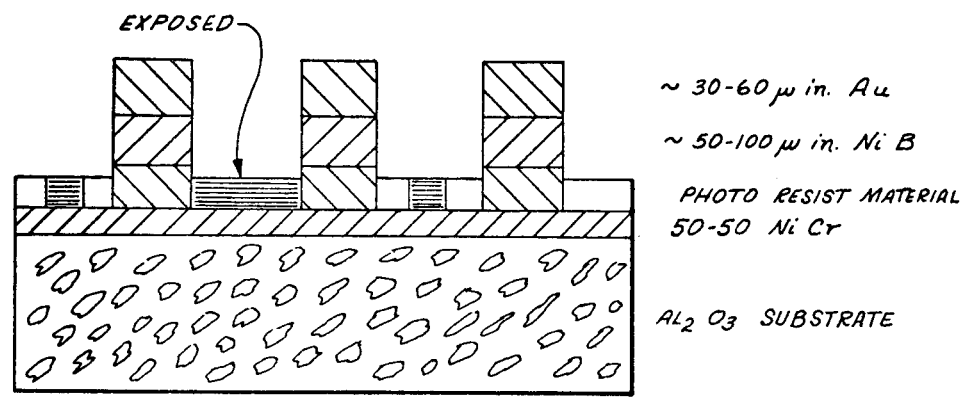
FIG_6
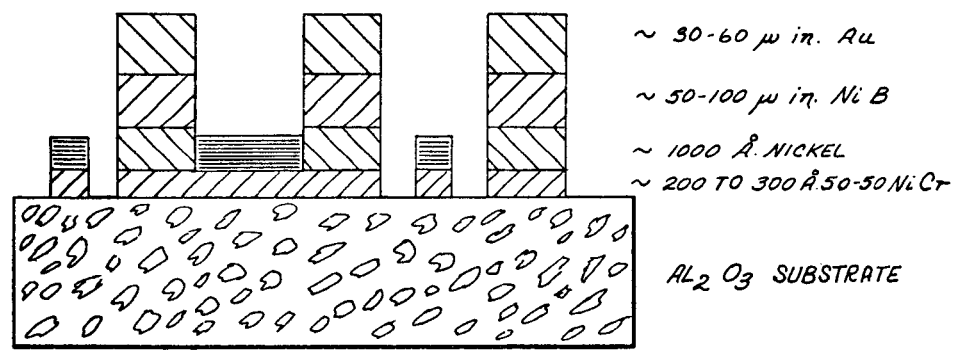

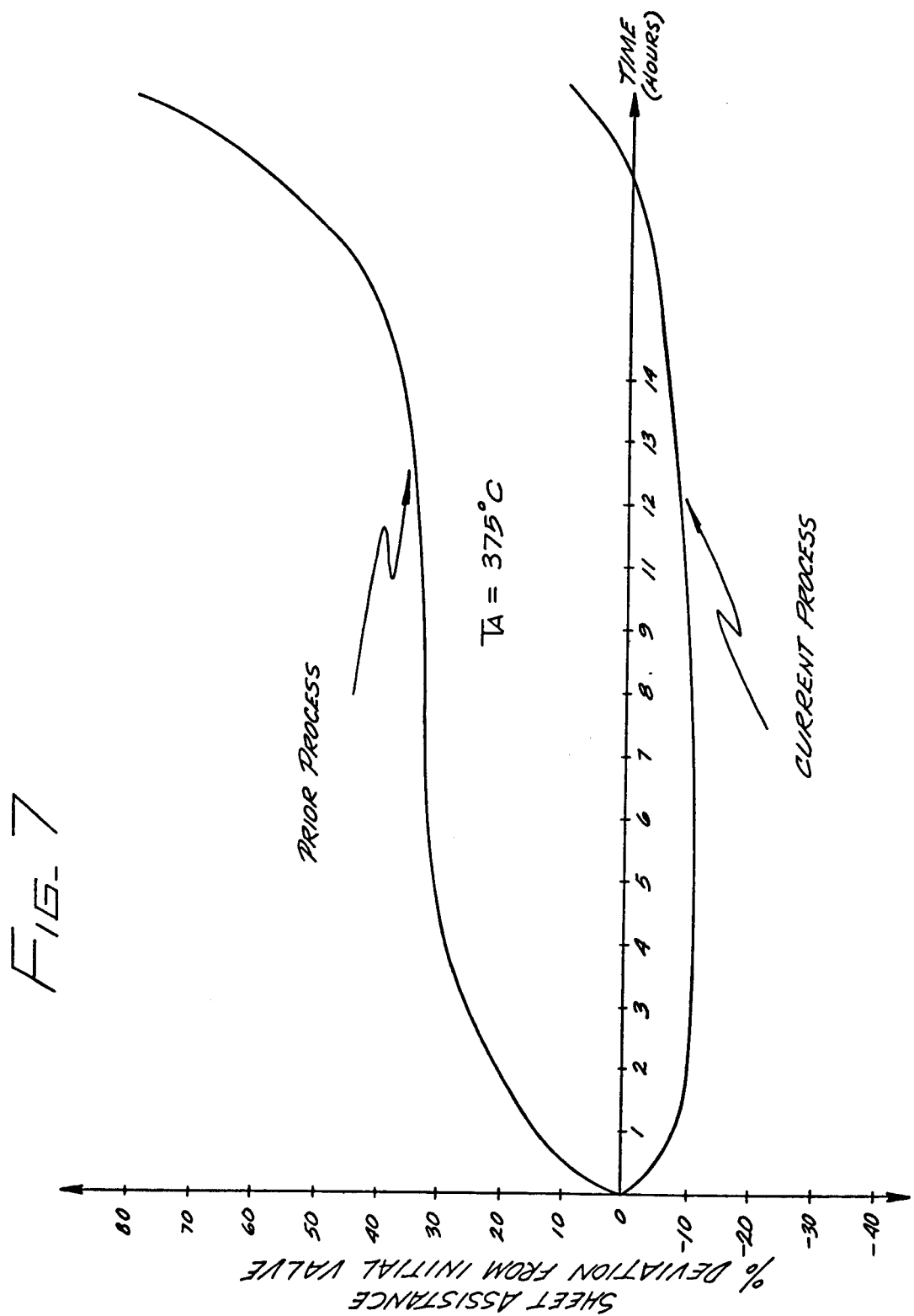

SOLDERABLE THIN FILM MICROCIRCUIT WITH STABILIZED RESISTIVE FILMS

This is a division of application Ser. No. 507,184, filed Sept. 9, 1974, now U.S. Pat. No. 3,904,461, dated Sept. 9, 1975, which is a continuation of application Ser. No. 293,988, filed Oct. 2, 1972, and now abandoned.

BACKGROUND OF THE INVENTION

In the manufacture of hybrid integrated circuits, problems are encountered in bonding semiconductors to the circuit board or blank, in connecting the semiconductors electrically with the conductor tracks and in connecting other passive or active components and jumper wires to the board. In some applications the semiconductors may be attached by means of epoxy bonding, but the present invention is not concerned with applications for which this technique can be used. It is concerned only with all-metal assembly systems such as are required for meeting difficult environmental conditions, particularly as required by certain military specifications.

A typical integrated circuit assembly made according to the prior art is shown in section in FIG. 1. On a substrate of aluminum oxide, beryllium oxide or sapphire, a layer of 80–20% nickel-chromium is sputtered or vacuum-deposited to a thickness sufficient to obtain the required sheet resistance (typically 200–300 A). A layer of pure nickel approximately 1000 Angstrom units thick is then deposited over the nickel-chromium layer, and this is followed by an electro-deposition of pure gold 30 to 150 microinches thick.

Attachment of components, etc. to the board described above requires high-temperature eutectic bonding (375° C, typically) for attaching semiconductors to the substrate and moderate-temperature solder (300° C) for attaching passive components to the substrate. Low-temperature solder is used for mounting the substrate into a package and also for sealing the package. Since semiconductors are susceptible to damage from excessive heat, any reworking or repairs requiring moderate to high temperatures carry substantial risk of further damage or destruction of the integrated curcuit. In actuality, it has often proven impractical to attempt to repair such devices, and they have had to be replaced.

Another difficult problem occurs in effecting solder connections to the gold surface without risk of immediate or long-term failures. Low-temperature solders are not compatible with gold because they normally contain tin which absorbs the gold, thereby disrupting electrical conduction through the associated conductor. High-temperature solders are of high lead or gold alloys and are difficult to use in some applications because they can cause changes in the resistance of certain thin film devices. Because the gold alloys are "hard" solders, stress relief in multiterminal components is not possible, causing potential physical failure of such components. Also, the heat required is prohibitive to certain discrete components.

Where ultrasonic wire bonding techniques are used, it is necessary to have a surface which is compatible with the aluminum wires used on most semiconductor components. Bonding aluminum to gold frequently results in the formation of intermetallics (sometimes called "purple plague") which adversely affects the strength of the bond. These intermetallics, combined with a bulk diffusion process (Kirkendall voiding) is often destructive to the bond, reducing the circuit reliability.

The nickel-chromium layer is deposited for the purpose of supplying a resistive layer, and after the resistor patterns are formed the circuit board assembly is normally heat-treated to allow the resistors to increase in resistance value through oxidation. This heat-treating process normally requires several hours before a reasonably stable value is reached, which is time-consuming and expensive and still leaves much to be desired in terms of long-term stability of resistance values. Also, the times for heat-treating vary according to the characteristics of each particular substrate. Alternatively, the resistors are coated with a protective layer such as silicon monoxide which protects the resistors from oxidation so that the resistance stabilization is largely brought about through annealing. This latter system often involves depositing patterns through masks—an inefficient process.

A similar problem has been experienced in attempting to bond semiconductor chips, etc. to the integrated circuit boards. The semiconductors may be supplied without gold or with an evaporated or an alloyed gold layer for making electrical contact between the mounting surfaces of the semiconductor and the conductors on the circuit boards. Because of the above described problems in soldering to gold, low-temperature tin bearing solders cannot be used on those semiconductors. Techniques used involve either the use of conductive epoxy, which has disadvantages in poor resistance to high temperatures, susceptibility to resistance changes, and unreliability as to electrical connections, or high-temperature eutectic brazing alloys which generally render the connections unrepairable and which require that semiconductor dice be mounted individually, resulting in excessive exposure of the assembly to elevated temperatures.

With the requirements described above, it will be apparent that a relatively high skill level is required of those doing the various tasks required to manufacture such integrated curcuits, and any significant reduction in the skill level required of operators will result in appreciable savings in the cost of producing such circuit boards.

DESCRIPTION OF THE DRAWINGS

FIG. 1 is a sectional view of a sample integrated circuit board with conducting layers according to the prior art;

FIG. 2 is a sectional view of an integrated circuit board similar to that of FIG. 1, but including an additional layer according to my invention;

FIG. 3 is a sectional view of the board of FIG. 2 with a part of the gold layer removed;

FIG. 4 is a sectional view of the board of FIG. 2 with parts of the gold, nickel and nickel-boron layers removed;

FIG. 5 is a sectional view of the board as in FIG. 4, but with the original photo-resist layer removed and a new photo-resist layer protecting the nickel-chromium layer;

FIG. 6 is a sectional view of the board of FIG. 5 with the unprotected nickel-chromium layer removed; and FIG. 7 is a graph showing curves of sheet resistance vs. time for the heat-treat process as required by the prior art and as required by applicant's invention.

THE INVENTION

The addition of a layer of nickel-boron to a thickness of 50 to 100 microinches between the pure nickel layer and the gold layer, as shown in FIG. 2, provides a number of substantial advantages in the manufacture of integrated circuit boards. Standard photolithographic techniques are used to print on a desired pattern of conductors. Those skilled in the art will appreciate that either negative or positive photo-resist materials may be used, but the present description assumes positive materials which are hardened from exposure to light and are not washed away, thus remaining to protect the desired pattern. It will also be appreciated that it is impractical to attempt to portray the layers drawn to scale.

Referring to FIG. 3, the layer of photo-resist material is labeled as exposed, and the board has been exposed to a selective etchant which has removed the gold except where protected. A second selective etchant removes the unprotected nickel and nickel-boron layers, leaving the nickel-chromium layer exposed as shown in FIG. 4. The photo-resist material is then removed, and new photo-resist material is applied and a new pattern is masked and exposed to light (see FIG. 5). The unexposed photo-resist material is then removed, and the unprotected nickel-chromium layer is removed to provide the desired resistor pattern as shown in FIG. 6. The remaining photo-resist material is then removed, resulting in a board having conductor tracks and resistors and to which may be attached semiconductors, jumper wires, and/or capacitors or other active or passive components. Although not specifically shown in the drawings, those skilled in the art will recognize that with an additional masking operation some area of nickel-boron may be left exposed while part of the gold is removed therefrom or the gold may, in some applications, be omitted altogether.

Use of the metalizing system described above on integrated circuit boards is advantageous in connection with soldering, ultrasonic wire bonding, and with the heat-treating step. A nickel-boron layer may also be used to advantage in printing assembly instructions on the board, as will be described hereafter. Also, a technique very similar to that described in connection with the circuit boards is also useful for metalizing semiconductors to aid in fastening them to the boards.

Where soldering is required, the use of a low-temperature, high-strength, tin-based solder is permissible because the nickel-boron layer is an effective solder barrier and is quite compatible with all solders and brazing alloys used in integrated circuit manufacture. In this case the gold layer may be taken up by the tin at the point of contact, but this is of no consequence since it is the bond to the nickel-boron layer which is relied upon for strength. The relatively small percentage of absorbed gold in the solder at the joint does not affect the characteristics or reliability of the bond.

The nickel-boron layer is also completely compatible with aluminum ultrasonic wire bonding and forms bonds which are typically up to 50% stronger than those previously experienced. In this case the gold layer is not present at the point of bonding, so the above-described problems associated with aluminum to gold contacts are eliminated.

The heat-treating step is also considerably simplified and improved when the nickel-boron layer is present. This layer acts to stabilize the nickel-chromium resistive layer which reaches its nominal resistance value largely by annealing. There is no need to resort to passivation by covering the resistive layer with silicon monoxide for most applications. As compared with the prior art film stabilization process, a more stable resistance value is reached in shorter heat-treat time (see FIG. 7). In addition, the variability of the nickel-chromium film characteristics is significantly reduced when a single plate or number of plates within a sputter run are considered.

This same process may be used in connection with metalization of semiconductor chips, dice, etc. which are to be fastened to the integrated circuit boards. When the semiconductors are supplied with alloyed gold on their mounting surfaces, they are then coated with successive layers of nickel-chromium, nickel, nickel-boron, and preferably a thin layer of gold as described above. With the semiconductors thus metalized, there is no need to use high-temperature eutectic brazing since low-temperature tin-based solder provides very adequate bonds. Rather than having to attach the semiconductor dice singly, they can be attached to a hybrid circuit in large numbers with considerably reduced exposure to the assembly to excessive temperatures or processing time and handling.

A still further advantage of the metalizing system described above may be realized in connection with marking and/or the printing of assembly instructions on the boards. With a circuit board fabricated as described above, the board may be replated with nickel-boron to a comparable thickness. A photo-resist material is then applied, exposed to light through a mask, developed, and the unprotected nickel-boron is etched away, thus leaving the desired marking. This system can save substantial time in the assembly of components and wires, and can be used even where circuitry is relatively dense.

Some modifications will occur to those skilled in the art. Where a resistive layer is not required, the nickel-chromium layer may be replaced with a chromium layer, and the benefits of the nickel-boron layer as to soldering, wire-bonding, high temperature operation and ease of attachment of semiconductors will still be present.

We claim:

1. A hybrid microcircuit board comprising:
   a substrate of high-temperature insulating material,
   a resistive layer of nickel-chromium deposited on said substrate,
   a film of nickel deposited on said nickel-chromium layer, and
   a layer of nickel-boron deposited on said nickel layer,
   said microcircuit board being heat-treated to stabilize said resistive layer.

2. A hybrid microcircuit board as set forth in claim 1 wherein a layer of gold is deposited on said nickel-boron layer.

3. A hybrid microcircuit board as set forth in claim 2 wherein portions of said gold, nickel-boron, and nickel layers are removed to form conductive tracks and portions of said nickel-chromium layer are removed to form resistors.

4. A microcircuit board comprising:
   a substrate of high-temperature insulating material,
   a resistive layer of nickel-chrome deposited on said substrate,
   a film of nickel deposited on said nickel-chromium layer, and
   a layer of nickel-boron deposited on said nickel layer.

5. A microcircuit as set forth in claim 4 wherein a layer of gold is deposited on said nickel-boron layer.

* * * * *